(12) United States Patent
Hishiya et al.

(10) Patent No.: US 12,334,380 B2
(45) Date of Patent: Jun. 17, 2025

(54) BOAT TRANSFER METHOD AND HEAT TREATMENT APPARATUS

(71) Applicant: Tokyo Electron Limited, Tokyo (JP)

(72) Inventors: Shingo Hishiya, Yamanashi (JP);
Hiroaki Ikegawa, Yamanashi (JP);
Volker Hemel, Dresden (DE);
Bernhard Zobel, Dresden (DE); Sung Duk Son, Gyeonggi-do (KR)

(73) Assignee: Tokyo Electron Limited, Tokyo (JP)

( * ) Notice: Subject to any disclaimer, the term of this patent is extended or adjusted under 35 U.S.C. 154(b) by 368 days.

(21) Appl. No.: 17/449,848

(22) Filed: Oct. 4, 2021

(65) Prior Publication Data

US 2022/0122867 A1    Apr. 21, 2022

(30) Foreign Application Priority Data

Oct. 19, 2020   (JP) ................... 2020-175464

(51) Int. Cl.
| | |
|---|---|
| H01L 21/677 | (2006.01) |
| C23C 16/44 | (2006.01) |
| C23C 16/455 | (2006.01) |
| H01L 21/67 | (2006.01) |
| H01L 21/673 | (2006.01) |

(52) U.S. Cl.
CPC .... *H01L 21/67751* (2013.01); *C23C 16/4402* (2013.01); *C23C 16/4408* (2013.01); *C23C 16/455* (2013.01); *H01L 21/67109* (2013.01); *H01L 21/67303* (2013.01); *H01L 21/67739* (2013.01); *H01L 21/67757* (2013.01); *H01L 21/67098* (2013.01)

(58) Field of Classification Search
None
See application file for complete search history.

(56) References Cited

U.S. PATENT DOCUMENTS

| | | | | |
|---|---|---|---|---|
| 5,595,602 A | * | 1/1997 | Harlan | ............... C23C 16/45568 |
| | | | | 118/723 MP |
| 2011/0114623 A1 | * | 5/2011 | Goodman | ......... H01L 21/67109 |
| | | | | 219/385 |
| 2012/0100722 A1 | * | 4/2012 | Asai | .................... H01L 21/0337 |
| | | | | 438/758 |

(Continued)

FOREIGN PATENT DOCUMENTS

| | | |
|---|---|---|
| JP | H04-015915 | 1/1992 |
| JP | 2000-277432 | 10/2000 |
| JP | 2002-280385 | 9/2002 |

(Continued)

OTHER PUBLICATIONS

JP-2002280385-A English translation (Year: 2002).*

(Continued)

*Primary Examiner* — Michael G Hoang
*Assistant Examiner* — Kurt J Wolford
(74) *Attorney, Agent, or Firm* — IPUSA, PLLC

(57) ABSTRACT

With respect to a boat transfer method for transferring a boat holding a substrate into a processing chamber, the boat transfer method includes supplying a reducing gas into the processing chamber, and transferring the boat into the processing chamber in a state in which the reducing gas is present within the processing chamber.

8 Claims, 5 Drawing Sheets

(56) References Cited

U.S. PATENT DOCUMENTS

2012/0258415 A1* 10/2012 Yoshii ............... H01L 21/67248
                                                                                               432/9
2020/0303234 A1* 9/2020 Matsui .............. H01L 21/67103

FOREIGN PATENT DOCUMENTS

| JP | 2002280385 | A | * | 9/2002 | | |
| JP | 2004165533 | A | * | 6/2004 | ......... | C23C 16/4408 |
| JP | 2009-170827 | | | 7/2009 | | |
| JP | 2010-209465 | | | 9/2010 | | |
| JP | 2020-107854 | | | 7/2020 | | |
| KR | 20060003187 | A | * | 1/2006 | | |
| KR | 20060055817 | A | * | 5/2006 | | |

OTHER PUBLICATIONS

JP 2002280385 A human translation of paras. 5-7 (Year: 2024).*
Choi_Effects_of_high_temperature_forming _....pdf (Year: 2004).*
JP-2004165533-A translation (Year: 2004).*
KR-20060003187-A translation (Year: 2006).*
KR-20060055817-A translation (Year: 2006).*

* cited by examiner

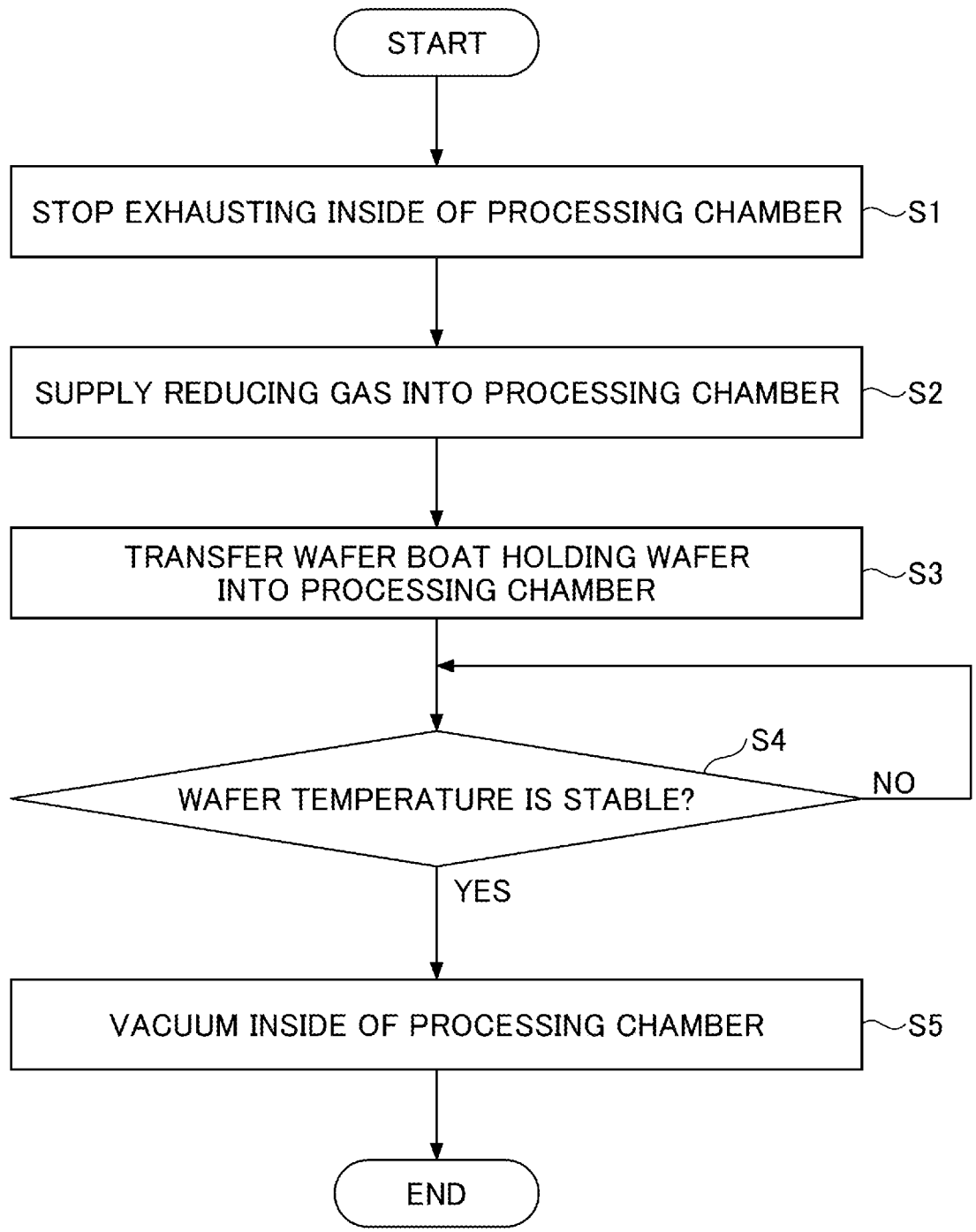

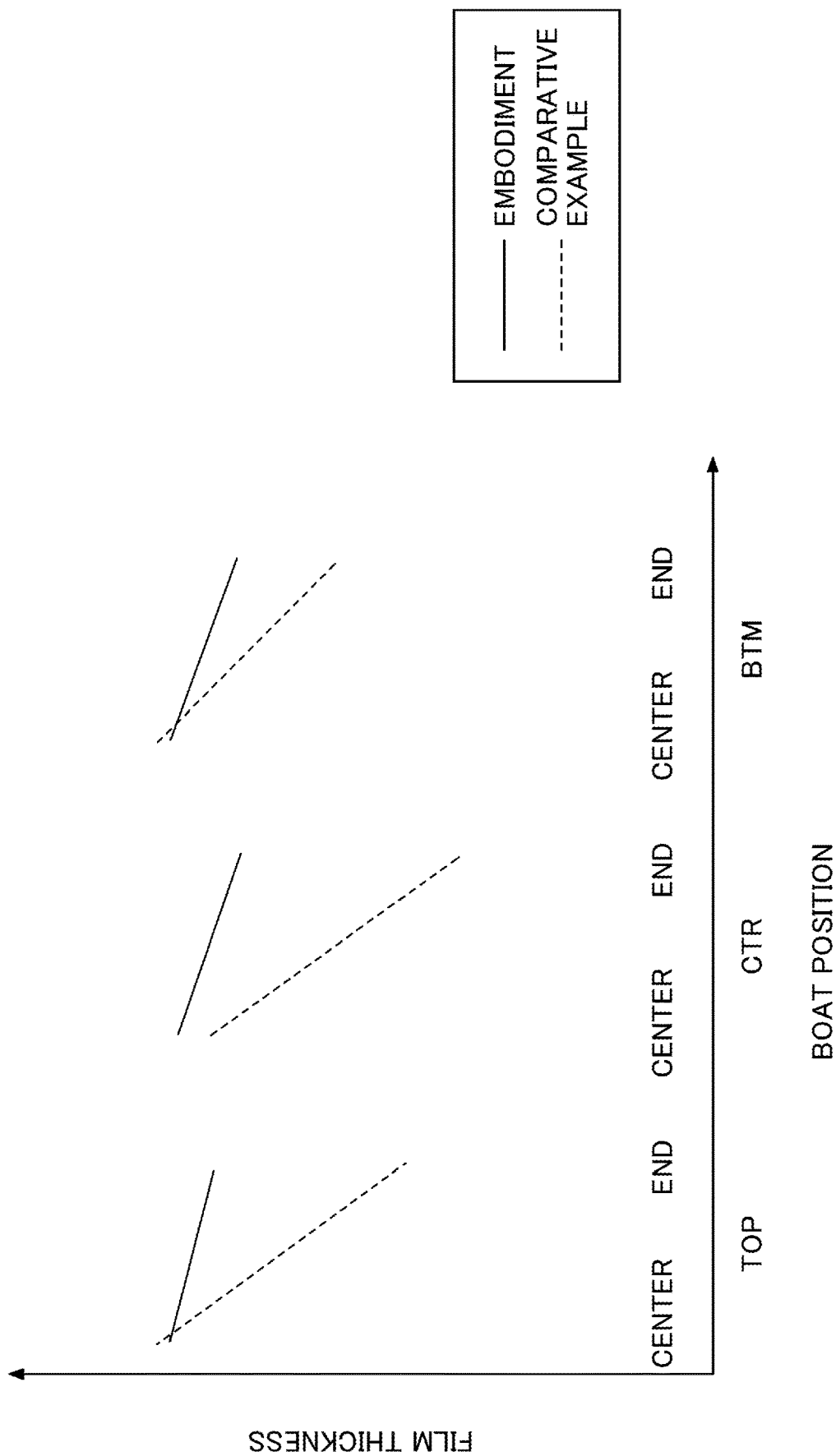

BOAT TRANSFER METHOD AND HEAT TREATMENT APPARATUS

CROSS-REFERENCE TO RELATED APPLICATIONS

This patent application is based on and claims priority to Japanese Patent Application No. 2020-175464 filed on Oct. 19, 2020, the entire contents of which are incorporated herein by reference.

TECHNICAL FIELD

The present disclosure relates to a boat transfer method and a heat treatment apparatus.

BACKGROUND

A technique in which, while an $N_2$ gas is supplied to an inner cylinder from a gap formed between an outer cylinder and the inner cylinder that constitute a processing chamber, a thin film is formed on the surface of the wafer after a boat on which a wafer is mounted is inserted into the inner cylinder, and the inside of the processing chamber is airtightly sealed (see, for example, Patent Document 1) is known.

RELATED ART DOCUMENT

Patent Document

[Patent Document 1] Japanese Laid-open Patent Application Publication No. 2002-280385

SUMMARY

According to one aspect of the present disclosure, with respect to a boat transfer method for transferring a boat holding a substrate into a processing chamber, the boat transfer method includes supplying a reducing gas into the processing chamber, and transferring the boat into the processing chamber in a state in which the reducing gas is present within the processing chamber.

BRIEF DESCRIPTION OF THE DRAWINGS

FIG. 4 is a flowchart illustrating an example of a boat transfer method according to the embodiment; and FIG. 5 is a graph illustrating results of performing the boat transfer method according to the embodiment together with results of performing a comparative example.

DETAILED DESCRIPTION OF EMBODIMENTS

Figure 1:
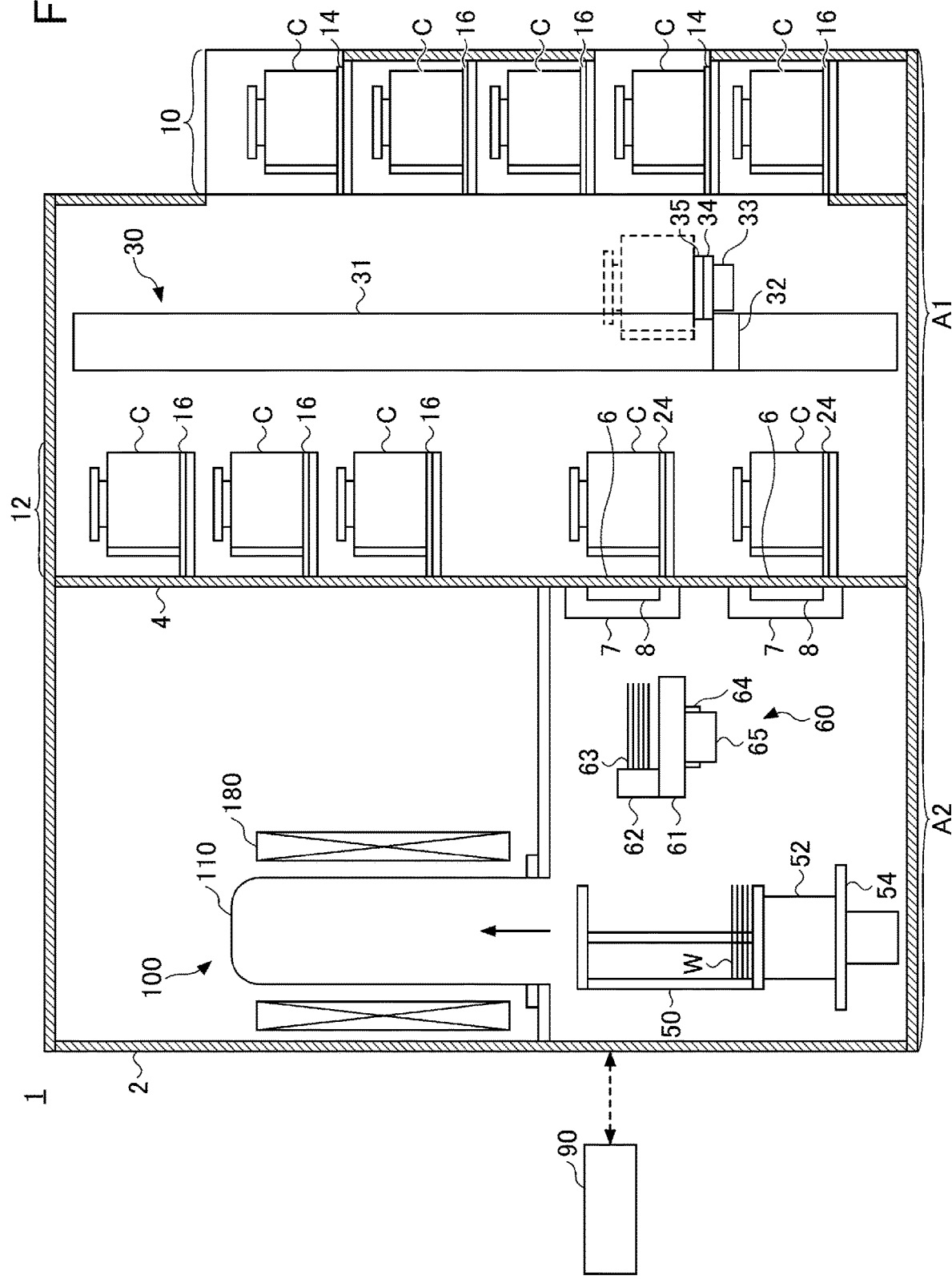
FIG. 1 is a schematic diagram illustrating an example of a heat treatment apparatus according to an embodiment.

In the following, an embodiment of the present disclosure, which is a non-restrictive example, will be described with reference to the accompanying drawings. In all the accompanying drawings, the same or corresponding parts or components are referenced by the same or corresponding reference numerals and description is omitted.

[Heat Treatment Apparatus]

Figure 2:
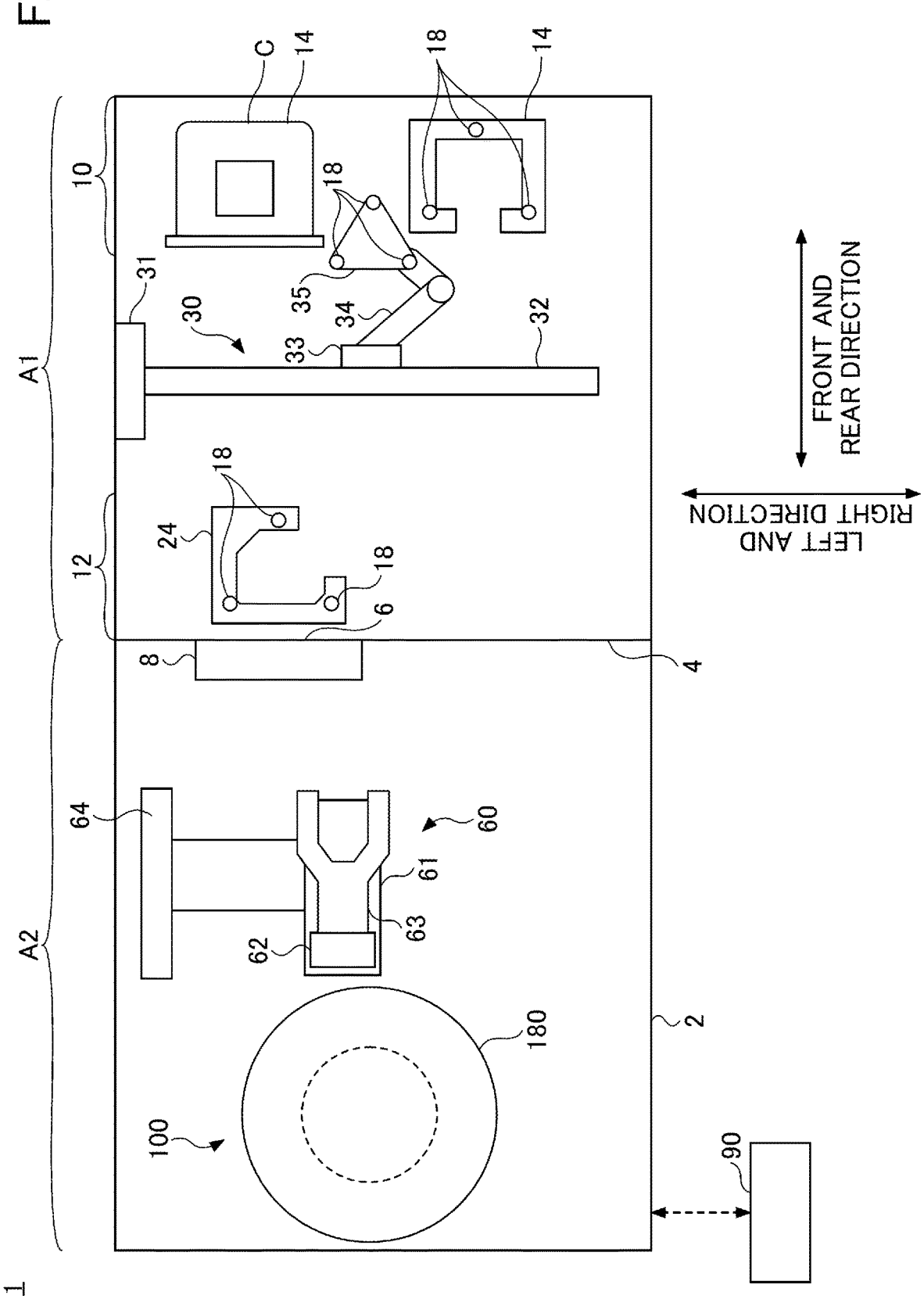
FIG. 2 is a schematic diagram illustrating an example of the heat treatment apparatus according to the embodiment.

An example of a heat treatment apparatus according to the embodiment will be described with reference to FIG. 1 and FIG. 2.

A heat treatment apparatus 1 is configured to be housed in a housing 2 constituting an outer body of the apparatus. In the housing 2, a carrier transfer area A1 and a wafer transfer area A2 are formed. The carrier transfer area A1 and the wafer transfer area A2 are separated by a partition wall 4. In the partition wall 4, a transfer port 6 for communication between the carrier transfer area A1 and the wafer transfer area A2 and transferring the wafer W is provided. The transfer port 6 is opened and closed by a door mechanism 8 in accordance with the front-opening interface mechanical standard (FIMS) standard. A drive mechanism of a cover opening-closing device 7 is connected to the door mechanism 8, and the door mechanism 8 is configured to move in the front and back direction and the up and down direction by the drive mechanism, and the transfer port 6 is opened and closed.

In the following, a direction in which the carrier transfer area A1 and the wafer transfer area A2 are arranged is the front-rear direction, and a horizontal direction perpendicular to the front-rear direction is the left-right direction.

The carrier transfer area A1 is an area in the atmosphere. The carrier transfer area A1 is an area in which a carrier C in which the semiconductor wafer (hereinafter, referred to as the "wafer W") is accommodated is transferred between the elements described later in a heat treatment apparatus 1, transferred into the heat treatment apparatus 1 from the outside, and transferred from the heat treatment apparatus 1 to the outside. The carrier C may be, for example, a front-opening unified pod (FOUP). The cleanliness inside the FOUP is maintained at a predetermined level, thereby preventing adhering foreign matters to the surface of the wafer W and preventing the formation of a natural oxide film on the surface of the wafer W. The carrier transfer area A1 includes a first transfer area 10 and a second transfer area 12 located behind the first transfer area 10 (on the wafer transfer area A2 side).

In the first transfer area 10, two load ports 14 (see FIG. 1) are provided in the upper and lower direction and two load ports 14 (see FIG. 2) are provided in the left and right direction at each stage, for example. The load port 14 is a mounting table for receiving the carrier C when the carrier C is transferred into the heat treatment apparatus 1. The load port 14 is provided at a place where the wall of the housing 2 is opened, and the heat treatment apparatus 1 can be accessed from the outside. Specifically, a transfer device (which is not illustrated) provided outside the heat treatment apparatus 1 enables the carrier C to be transferred and mounted on the load port 14 and the carrier C to be transferred from the load port 14 to the outside. Additionally, the load ports 14 are, for example, provided at two stages in the up and down direction, and thus the carrier C can be transferred into the heat treatment apparatus and transferred to the outside at both stages. A stocker 16 may be provided at a lower stage from the load port 14 to store the carrier C. On the surface of the load port 14 where the carrier C is mounted, for example, three positioning pins 18 that position the carrier C are provided at three locations. Additionally, the load port 14 may be configured to move in the front and rear direction in a state in which the carrier C is mounted on the load port 14.

Two FIMS ports 24 (see FIG. 1) are arranged in the up and down direction at the lower portion of the second transfer area 12. The FIMS port 24 is a holding table that holds the carrier C when the wafer W in the carrier C is transferred into a heat treatment furnace 100 described below in the wafer transfer area A2 and is transferred to the outside. The FIMS port 24 is configured to move in the front and rear direction. As with the load port 14, three positioning pins 18 that position the carrier C are provided on the surface of the FIMS port 24 on which the carrier C is provided.

The stocker 16 that stores the carrier C is provided at the upper portion of the second transfer area 12. The stocker 16 includes, for example, three shelves, each of which can mount two or more carriers C in the left and right direction. Additionally, the stocker 16 may be provided at the lower portion of the second transfer area 12 even in an area in which the carrier mounting table is not disposed.

Between the first transfer area 10 and the second transfer area 12, a carrier transfer mechanism 30 that transfers the carrier C between the load port 14, the stocker 16, and the FIMS port 24 is provided.

The carrier transfer mechanism 30 includes a first guide 31, a second guide 32, a moving portion 33, an arm 34, and a hand 35. The first guide 31 is configured to extend in the up and down direction. The second guide 32 is connected to the first guide 31 and is configured to extend in the left and right direction. The moving portion 33 is configured to move in the left and right direction while being guided by the second guide 32. The arm 34 has one joint and two arms and is provided in the moving portion 33. The hand 35 is provided at the distal end of the arm 34. In the hand 35, three pins 18 that position the carrier C are provided at three locations.

The wafer transfer area A2 is an area in which the wafer W is removed from the carrier C and various processing is performed. The wafer transfer area A2 is in an inert gas atmosphere, e.g., a nitrogen ($N_2$) gas atmosphere, to prevent an oxide film from being formed on the wafer W. This maintains the oxygen ($O_2$) gas concentration in the wafer transfer area A2 to be, for example, less than 30 ppm. The vertical heat treatment furnace 100 having an opening at the lower end as a furnace opening is provided in the wafer transfer area A2.

The heat treatment furnace 100 can accommodate the wafer W and has a quartz cylindrical processing chamber 110 for heat treatment of the wafer W. A cylindrical heater 180 is disposed around the processing chamber 110 and heat treatment is performed on the accommodated wafer W by the heating of the heater 180. A shutter (which is not illustrated) is provided under the processing chamber 110. The shutter is a door to cover the lower end of the heat treatment furnace 100 from when the wafer boat 50 is transferred from the heat treatment furnace 100 to when the next wafer boat 50 is transferred into the heat treatment furnace 100. Below the heat treatment furnace 100, the wafer boat 50 is mounted over a cover 54 through a heat insulating cylinder 52. In other words, the cover 54 is integrally provided with the wafer boat 50 under the wafer boat 50.

The wafer boat 50 is made of, for example, quartz, and is configured to hold large diameter wafers W (e.g., 300 mm or 450 mm in diameter) substantially horizontally in multiple stages with predetermined spacing in the up and down direction. The number of the wafers W accommodated in the wafer boat 50 is not particularly limited, and may be, for example, from 50 to 200. The cover 54 is supported by a lift mechanism 56 (FIG. 3), and the wafer boat 50 is transferred into or from the heat treatment furnace 100 with the lift mechanism 56. A wafer transfer device 60 is provided between the wafer boat 50 and the transfer port 6.

The wafer transfer device 60 transfers the wafer W between the carrier C held on the FIMS port 24 and the wafer boat 50. The wafer transfer device 60 includes a guide mechanism 61, a moving body 62, a fork 63, a lift mechanism 64, and a rotate mechanism 65. The guide mechanism 61 is formed as a cuboid. The guide mechanism 61 is attached to the lift mechanism 64 that extends vertically. The guide mechanism 61 is configured to move vertically with the lift mechanism 64 and is configured to rotate with the rotate mechanism 65. The moving body 62 is provided on the guide mechanism 61 such that the moving body 62 can move in the front and rear direction along the longitudinal direction. The fork 63 is a transfer machine attached through the moving body 62 and multiple plates (e.g., five plates) are provided. The multiple plates of the fork 63 can be used to transfer multiple wafers W at the same time, and thus the time required to transfer the wafers W can be reduced. However, the fork 63 may have one plate.

A filter unit (which is not illustrated) may be provided on the ceiling or the sidewall of the wafer transfer area A2. Examples of the filter unit include a high efficiency particulate air (HEPA) filter and an ultra-low penetration air (ULPA) filter. Providing the filter unit can supply clean air to the wafer transfer area A2.

Additionally, a controller 90 that controls the entirety of the heat treatment apparatus 1 is provided in the heat treatment apparatus 1. The controller 90 controls operations of various devices within the heat treatment apparatus 1 in accordance with a recipe so that the heat treatment is performed under the various treatment conditions indicated in the recipe. The controller 90 also receives signals from various sensors provided within the heat treatment apparatus 1 to grasp the position of the wafer W and the like, and performs sequence control to advance the process.

The controller 90 includes computing and storage units such as a central processing unit (CPU), a read only memory (ROM), a random access memory (RAM), and the like. The controller 90 may be configured as a microcomputer that performs recipe processing by installing a program for performing the recipe processing from a storage medium in which the program is stored. The controller 90 may also be configured as an electronic circuit, such as an application specific integrated circuit (ASIC).

[Heat Treatment Furnace]

An example of the heat treatment furnace 100 of the heat treatment apparatus 1 according to the embodiment will be described with reference to FIG. 3.

The heat treatment furnace 100 has a longitudinally long shape extending vertically as a whole. The heat treatment furnace 100 includes a processing chamber 110 that is longitudinally long and that extends vertically.

The processing chamber 110 is formed of a refractory material such as quartz, silicon carbide, and the like. The processing chamber 110 has a double tube structure of a cylindrical inner tube 111 and an outer tube 112 having a ceiling that is concentrically mounted outside of the inner tube 111, for example. The lower end of the processing chamber 110 is airtightly held by, for example, a stainless steel manifold 120.

The manifold 120 is fixed to, for example, a baseplate (which is not illustrated). Injectors 130 and 140 and an exhaust port 150 are provided in the manifold 120.

The injector 130 passes through the manifold 120, is inserted into the inner tube 111 from below the inner tube 111, is bent in an L-shape, and extends upwardly along the side wall of the inner tube 111. The injector 130 is formed of, for example, quartz. The injector 130 is connected to a gas source 131 through piping 132 at an end of the injector 130 that is located outside of the processing chamber 110. A process gas is introduced in the injector 130 from the gas source 131 through the piping 132. A flow controller 133, a valve 134, and the like are provided on the piping 132. An end of the injector 130 that is located in the inner tube 111 is open. The injector 130 supplies the process gas introduced from the gas source 131 through the opening into the inner tube 111. Here, the injector 130 may be formed in a shape that extends horizontally within the inner tube 111 without being bent in an L-shape. Additionally, the injector 130 may have a form in which an opening at an end in the inner tube 111 is covered with a porous body and the process gas is discharged from pores of the porous body. This can widely spread the process gas within the inner tube 111, and thus reduce the variation of the concentration of the process gas in the inner tube 111.

The injector 140 passes through the manifold 120, is inserted between the inner tube 111 and the outer tube 112 from below the outer tube 112, is bent in an L-shape, and extends upwardly along the side wall of the inner tube 111 and the outer tube 112. The injector 140 is formed of, for example, quartz. The injector 140 is connected to a gas source 141 through piping 142 at an end of the injector 140 that is located outside of the processing chamber 110. The process gas is introduced in the injector 140 from the gas source 141 through the piping 142. A flow controller 143, a valve 144, and the like are provided on the piping 142. An end of the injector 140 that is located between the inner tube 111 and the outer tube 112 is open. The injector 140 supplies the process gas introduced from the gas source 141, from the opening to a space between the inner tube 111 and the outer tube 112. Here, the injector 140 may have a shape that extends horizontally within the inner tube 111 without being bent in an L-shape.

Examples of the process gas include deposition gases, etching gases, cleaning gases, purging gases, and reducing gases. The deposition gas is a gas for forming a film on the wafer W accommodated within the processing chamber 110 and examples of the deposition gas include at least one of a raw material gas including silicon (Si) and a metal, an oxide gas for oxidizing the raw material gas, and a nitride gas for nitriding the raw material gas. The etching gas is a gas for etching a film formed on the wafer W accommodated within the processing chamber 110, and examples of the etching gas include a gas containing halogen, such as fluorine (F) and chlorine (Cl). The cleaning gas is a gas for etching and removing deposits deposited in the processing chamber 110 and may be, for example, the same same gas as the etching gas. The purge gas is a gas for purging the gas remaining in the processing chamber 110, and examples of the purge gas include an inert gas, such as nitrogen ($N_2$) gas, and argon (Ar) gas. The reducing gas is a gas supplied into the processing chamber 110 when the wafer boat 50 is transferred into the processing chamber 110 and may be, for example, a forming gas that is a mixture of hydrogen ($H_2$) and nitrogen ($N_2$). Here, the reducing gas is required to be a mixture of hydrogen and an inert gas, and thus may be, for example a mixture of hydrogen and a noble gas such as argon (Ar).

The exhaust port 150 is used to exhaust the inside of the processing chamber 110. An exhaust piping 151 is connected to the exhaust port 150. An exhaust valve 152 and a vacuum pump 153 that can control pressure reduction inside of the processing chamber 110 are inserted in the exhaust piping 151. Examples of the exhaust valve 152 include, for example, an opening variable valve. Examples of the vacuum pump 153 include, for example, a dry pump and a turbomolecular pump.

A furnace port 121 is formed at the lower end of the manifold 120. A disc-shaped cover 54 made of stainless steel, for example, is provided at the furnace port 121.

The cover 54 is provided and configured to move up and down with the lift mechanism 56 and is configured to seal the furnace port 121 airtightly. The wafer boat 50 is mounted over the cover 54 through the heat insulating cylinder 52 that is constituted by heat insulating plates made of quartz, for example.

The wafer boat 50 is transferred into the processing chamber 110 by raising the cover 54 by using the lift mechanism 56 and is accommodated within the processing chamber 110. Additionally, the wafer boat 50 is transferred from the processing chamber 110 by lowering the cover 54. The wafer boat 50 has a groove structure in which multiple slots (supporting grooves) are provided in the longitudinal direction, and the wafers W are loaded in the slots such that the wafers W are in a horizontal state and there are vertical spaces between the wafers. The multiple wafers mounted on the wafer boat 50 constitute one batch and various heat treatments are performed in a unit of a batch.

A cylindrical heater 180 is disposed around the processing chamber 110. The heater 180 heats the wafer W accommodated within the processing chamber 110 up to a predetermined temperature.

Figure 3:
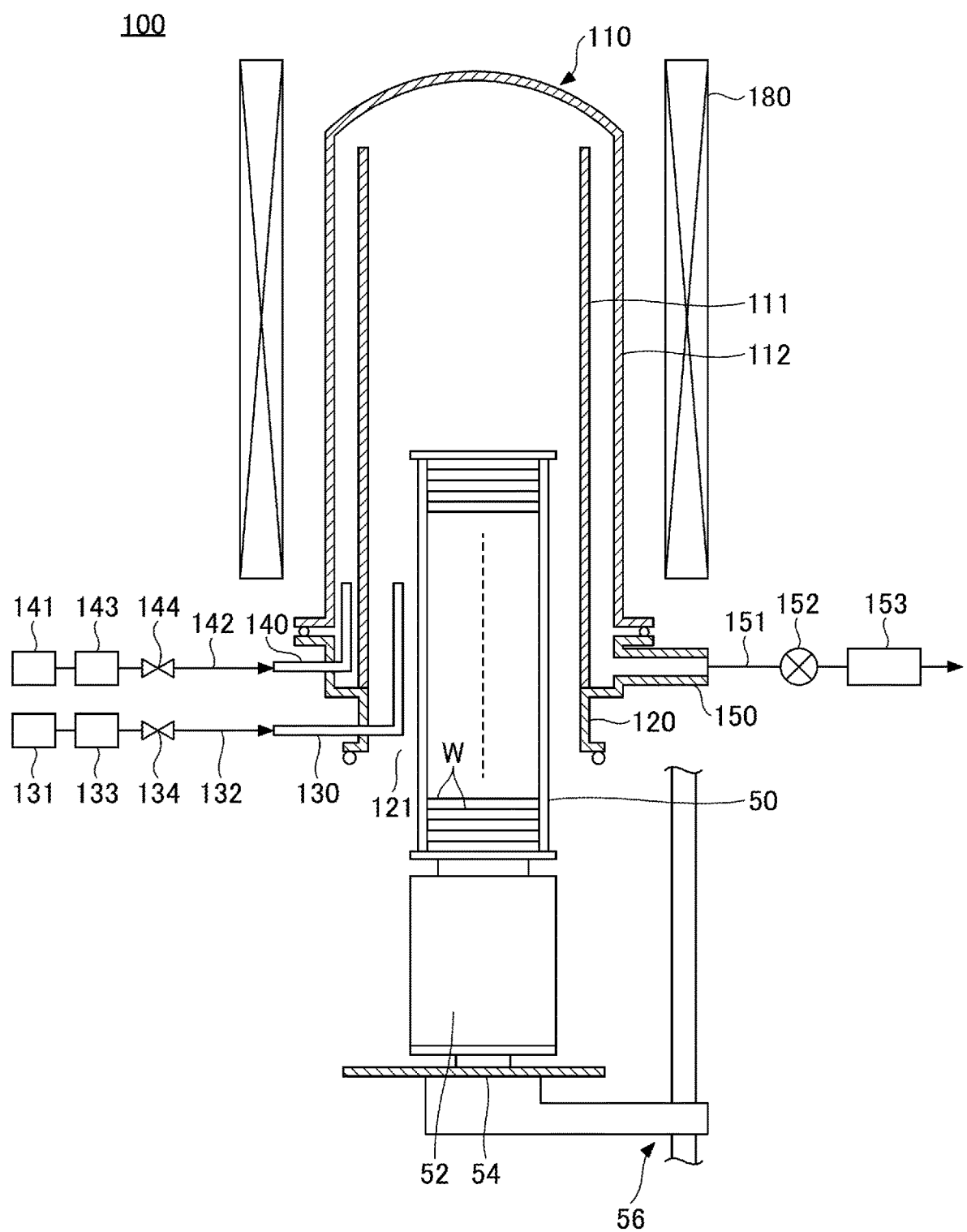
FIG. 3 is a schematic diagram illustrating an example of a heat treatment furnace of the heat treatment apparatus according to the embodiment.

Here, in the heat treatment furnace 100 illustrated in FIG. 3, a case in which two injectors 130 and 140 are included has been described, but the number of the injectors is not limited to this. For example, the number of the injectors may be one, or three or more.

If a predetermined film is formed by the heat treatment furnace 100 on the wafer W having a surface containing a metal film, the metal film may oxidize when the wafer boat 50 is transferred into the processing chamber 110 if the temperature within the processing chamber 110 is high (e.g., 100° C. to 530° C.)

Methods of suppressing oxidation of the metal film include, for example, a method of transferring the wafer boat 50 into the processing chamber 110 at high speed and, after the transfer, immediately vacuuming the inside of the processing chamber 110. However, this method has a problem in that friction caused by a difference in thermal expansion between the wafer W and the wafer boat 50 occurs at a portion where the wafer W held in the wafer boat 50 contacts the wafer boat 50, and particles caused by the friction are attached to the wafer W.

Methods of suppressing the attachment of the particles to the wafer W include, for example, a method of suppressing the thermal expansion of the wafer W and the wafer boat 50 by lowering the temperature (e.g., the room temperature) in the processing chamber 110 when the wafer boat 50 is transferred into the processing chamber 110. However, this method has a problem of deteriorating productivity because it takes a long time to raise the temperature within the processing chamber 110 to the temperature at which a predetermined film is deposited after the wafer boat 50 is transferred into the processing chamber 110.

In the embodiment, when the wafer boat 50 is transferred into the processing chamber 110, the reducing gas is supplied into the processing chamber 110 to suppress oxidation of the metal film formed on the surface of the wafer W held in the wafer boat 50. In the following, a boat transfer method according to the embodiment will be described in detail.

<Boat Transfer Method>

An example of the boat transfer method according to the embodiment will be described with reference to FIG. 4. The boat transfer method according to the embodiment will be described by using an example of a case in which the wafer boat 50 holding the wafer W is transferred into the processing chamber 110 at a high temperature (e.g., 100° C. to 530° C.) in the processing chamber 110. In the following, a case in which a metal film is formed on the surface of the wafer W will be described. However, even in a case in which a film other than a metal film is formed, the boat transfer method according to the embodiment can be applied. For example, the method is preferably applied in a case in which a film easily oxidized when exposed to oxygen, such as a nitride film, a silicon film, or the like, is formed on the surface of the wafer.

First, by closing the exhaust valve 152, the controller 90 stops the exhaust of the inside of the processing chamber 110 via the exhaust piping 151 with the vacuum pump 153 (exhaust stop step S1). However, the exhaust stop step S1 may be omitted.

Subsequently, by opening the valve 144, the controller 90 supplies the reducing gas from the injector 140 into the processing chamber 110 (reducing gas supply step S2). This causes a reducing atmosphere in the processing chamber 110. In the reducing gas supply step S2, the controller 90 preferably adjusts the flow rate of the reducing gas supplied from the injector 140 into the processing chamber 110 by controlling the flow controller 143 so that the inside of the processing chamber 110 is at a higher pressure than the outside (the wafer transfer area A2). This can prevent the external atmosphere of the processing chamber 110 from being introduced into the processing chamber 110 and mixed, when the wafer boat 50 is transferred into the processing chamber 110 in transfer step S3 described below. The reducing gas may be, for example, a forming gas that is a mixture of hydrogen ($H_2$) and nitrogen ($N_2$). Here, the reducing gas is only required to be a mixture of hydrogen and an inert gas, and may be, for example, a mixture of hydrogen and a noble gas such as argon (Ar). Because the hydrogen contained in the reducing gas is a gas lighter than an inert gas, such as nitrogen, a noble gas, or the like, the reducing gas tends to remain in the processing chamber 110. Therefore, by using a mixture of hydrogen and an inert gas as the reducing gas, the reducing atmosphere can be easily maintained in the processing chamber 110.

In the reducing gas supply step S2, the controller 90 may also cause the reducing gas to be supplied into the processing chamber 110 from the injector 130 instead of the injector 140, and may cause the reducing gas to be supplied into the processing chamber 110 from the injector 130 and the injector 140. For example, the reducing gas supply step S2 may be performed before the exhaust stop step S1 or the reducing gas supply step S2 and the exhaust stop step S1 may be performed at the same time.

Subsequently, the controller 90 controls the lift mechanism 56 to raise the cover 54, so that the wafer boat 50 is transferred into the processing chamber 110 (transfer step S3). At this time, the inside of the processing chamber 110 is in the reducing atmosphere, thereby suppressing oxidation of the metal film formed on the surface of the wafer W.

Subsequently, the controller 90 determines whether the temperature of the wafer W becomes stable at the temperature in the processing chamber 110 (temperature determination step S4). For example, in the temperature determination step S4, if a set time duration elapses after the wafer boat 50 is transferred into the processing chamber 110, the controller 90 determines that the temperature of the wafer W becomes stable at the temperature in the processing chamber 110. The set time duration is, for example, a time duration determined in accordance with the temperature in the processing chamber 110 when the wafer boat 50 is transferred into the processing chamber 110 and is calculated by preliminary experiments and the like. For example, in the temperature determination step S4, the controller 90 may measure the temperature of the wafer W held in the wafer boat 50 transferred into the processing chamber 110 with a radiating thermometer or the like, and may determine that the temperature of the wafer W becomes stable at the temperature in the processing chamber 110 if the measured temperature of the wafer W is stable at the temperature in the processing chamber 110. In the temperature determination step S4, if it is determined that the temperature of the wafer W becomes stable at the temperature in the processing chamber 110, the controller 90 proceeds to vacuum step S5. With respect to this, in the temperature determination step S4, if it is determined that the temperature of the wafer W does not become stable at the temperature in the processing chamber 110, the controller 90 continues the temperature determination step S4.

Subsequently, by opening the exhaust valve 152, the controller 90 causes the inside of the processing chamber 110 to be exhausted through the exhaust piping 151 with the vacuum pump 153, causes the inside of the processing chamber 110 to be vacuumed (vacuum step S5), and completes the process.

As described above, after the wafer boat 50 holding the wafer W having the metal film formed on the surface of the wafer W is transferred into the processing chamber 110 at the high temperature, a predetermined film is formed on the metal film within the processing chamber 110.

According to the boat transfer method of the embodiment described above, the method includes the reducing gas supply step S2 for supplying the reducing gas into the processing chamber 110 and the transfer step S3 for transferring the wafer boat 50 into the processing chamber 110 in a state in which the reducing gas is present in the processing chamber 110. This suppresses oxidation of the metal film formed on the surface of the wafer W held in the wafer boat 50 due to the action of the reducing gas when the wafer boat 50 is transferred into the processing chamber 110. As a result, the predetermined film can be formed on the metal film while suppressing oxidation of the metal film formed on the surface of the wafer W.

Additionally, according to the boat transfer method of the embodiment, it is preferable that the inside of the processing chamber 110 is set to be at a higher pressure than the outside in the reducing gas supply step S2. This prevents the external atmosphere of the processing chamber 110 from being introduced into the processing chamber 110 and mixed, when the wafer boat 50 is transferred into the processing chamber 110 in the transfer step S3. Therefore, oxidation of the metal film formed on the surface of the wafer W can be particularly suppressed.

Further, according to the boat transfer method of the embodiment, in the reducing gas supply step S2, it is preferable that an opening at an end of the inner tube 111 is covered with a porous body, and the reducing gas is supplied by the injector 140 that discharges the reducing gas from pores of the porous body. This causes the reducing gas to widely spread within the inner tube 111, thereby reducing the variation of the concentration of the reducing gas within the inner tube 111.

Additionally, according to the boat transfer method of the embodiment, it is preferable to have the exhaust stop step S1 in which the exhaust of the inside of the processing chamber 110 is stopped before the reducing gas supply step S2. This can fill the processing chamber 110 with the reducing gas. Therefore, oxidation of the metal film formed on the surface of the wafer W can be suppressed while suppressing the use amount of the reducing gas.

Additionally, according to the boat transfer method of the embodiment, it is preferable to perform the vacuum step S5 in which the inside of the processing chamber 110 is vacuumed after the temperature of the wafer W becomes stable after the transfer step S3. This can suppress the occurrence of friction due to the difference in thermal expansion between the wafer W and the wafer boat 50, and can prevent particles caused by the friction from being attached to the wafer W.

EXAMPLE OF THE EMBODIMENT

An example of the embodiment performed for checking the effect of the boat transfer method of the embodiment will be described with reference to FIG. 5. In the example, according to the boat transfer method of the embodiment described above, after the wafer boat 50 holding the wafer W having the metal film formed on the surface of the wafer W is transferred into the processing chamber 110 at the high temperature, a polysilicon film is formed on the metal film within the processing chamber 110. In the example, in the reducing gas supply step S2 of the boat transfer method of the embodiment, a foaming gas (hydrogen 4% and nitrogen 96%) was supplied into the processing chamber 110 as the reducing gas at a flow rate of 50 slm. For comparison, after the wafer boat 50 was transferred into the processing chamber 110 in the same manner as the example except that the reducing gas used in the example was changed to an $N_2$ gas, a polysilicon film was formed on the metal film.

Additionally, the film thickness of the polysilicon film formed on the metal film was measured in the example and the comparative example. FIG. 5 is a graph illustrating a result of performing the boat transfer method according to the embodiment together with a result of the comparative example. In FIG. 5, the horizontal axis indicates a position in the wafer boat 50 (the boat position) and the vertical axis indicates the film thickness of the polysilicon film. FIG. 5 indicates results of measuring the film thickness of the polysilicon film at the center and end of the wafer W in each of the top (TOP) of the wafer boat 50, the center (CTR) of the wafer boat 50 and the bottom (BTM) of the wafer boat 50, in the up and down direction. In FIG. 5, the solid lines indicate the results of the example and the dashed lines indicate the results of the comparative example.

As illustrated in FIG. 5, in the comparative example, at all boat positions (TOP, CTR, and BTM), the film thickness of the polysilicon film at the end of the wafer W is significantly thinner than that of the polysilicon film at the center of the wafer W. It is conceivable that this is because, in the comparative example, the metal film formed on the end of the wafer W is oxidized by radiation from the periphery of the wafer boat 50 when the wafer boat 50 is transferred into the processing chamber 110, and the incubation time when the polysilicon film is being formed increases.

In contrast, in the example of the embodiment, the decrease in the film thickness of the polysilicon film at the end of the wafer W is suppressed at all boat positions (TOP, CTR, and BTM), in comparison with the comparative example. It is conceivable that this is because, in the example of the embodiment, oxidation of the metal film formed at the end of the wafer W when the wafer boat 50 is transferred into the processing chamber 110 is suppressed by the action of the reducing gas, and the incubation time when the polysilicon film is formed decreases.

This result indicates that if the wafer boat 50 is transferred into the processing chamber 110 in a state in which the processing chamber 110 is filled with the reducing gas, oxidation of the metal film at the end of the wafer W is suppressed, and the uniformity of the thickness of the polysilicon film in the surface of the wafer W is improved.

In the example of the embodiment, the film thickness of the polysilicon film is substantially the same regardless of the boat positions (TOP, CTR, and BTM). With respect to this, in the comparative example, the film thickness of the polysilicon film changes depending on the boat positions (TOP, CTR, and BTM). It is conceivable that this is because oxidation of the metal film is suppressed at all boat positions in the example in comparison with the comparative example.

This result indicates that if the wafer boat 50 is transferred into the processing chamber 110 in a state in which the processing chamber 110 is filled with the reducing gas, oxidation of the metal film formed on the wafer W is suppressed, and the uniformity of the film thickness of the polysilicon film among the wafers W is improved.

In the above embodiment, the lift mechanism 56 is an example of a transfer mechanism, the wafer boat 50 is an example of a boat, and the wafer W is an example of a substrate.

The embodiment disclosed herein should be considered to be exemplary in all respects and not restrictive. Omission, substitution, and alteration can be made to the above-described embodiment in various forms without departing from the scope of the appended claims and the spirit thereof.

In the above-described embodiment, a case in which the processing chamber 110 has a dual tube structure has been described, but the present disclosure is not limited to this. For example, the processing chamber 110 may have a single tube structure.

In the above-described embodiment, a case in which the substrate is a wafer W has been described, but the present disclosure is not limited to this. For example, the substrate may be a large substrate for a flat panel display (FPD), a substrate for an organic EL panel, or a substrate for a solar cell.

According to the present disclosure, a film can be formed while oxidation of an underlayer is suppressed.

While certain embodiments have been described, these embodiments have been presented by way of example only, and are not intended to limit the scope of the disclosures. The embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A heat treatment method comprising:
   preparing a boat holding a substrate, a metal film being formed on a surface of the substrate,
   supplying a reducing gas into a processing chamber,
   transferring the boat holding the substrate with the metal film formed thereon into the processing chamber in a state in which the reducing gas is present within the processing chamber, and forming a polysilicon film on the metal film of the substrate held by the boat transferred into the processing chamber,
wherein the reducing gas is a forming gas of 4% hydrogen and 96% nitrogen.

2. The boat transfer method as claimed in claim 1, wherein the supplying of the reducing gas causes an inside of the processing chamber to be at a higher pressure than an outside of the processing chamber.

3. The boat transfer method as claimed in claim 1, wherein the supplying of the reducing gas supplies the reducing gas from an injector having an opening covered by a porous body.

4. The boat transfer method as claimed in claim 1, further comprising stopping exhaust of an inside of the processing chamber, before the supplying of the reducing gas.

5. The boat transfer method as claimed in claim 1,
wherein the processing chamber is heated during the supplying of the reducing gas, and
wherein the boat transfer method further comprises determining whether a temperature of the substrate becomes stable, after the transferring of the boat.

6. The boat transfer method as claimed in claim 5, further comprising vacuuming an inside of the processing chamber, wherein the vacuuming is performed in a case where the determining determines that the temperature of the substrate becomes stable.

7. The boat transfer method as claimed in claim 1, wherein the boat holds a plurality of said substrates along a longitudinal direction of the processing chamber at a plurality of stages.

8. A heat treatment apparatus comprising:
a processing chamber configured to accommodate a boat holding a substrate;
an injector configured to supply a reducing gas into the processing chamber;
a transfer mechanism configured to transfer the boat into the processing chamber; and
a controller configured to control the transfer mechanism to perform:
preparing the boat holding the substrate, a metal film being formed on a surface of the substrate,
supplying the reducing gas into the processing chamber; and
transferring the boat holding the substrate with the metal film formed thereon into the processing chamber in a state in which the reducing gas is present within the processing chamber,
wherein the reducing gas is a forming gas of 4% hydrogen and 96% nitrogen, and
wherein the heat treatment apparatus forms a polysilicon film on the metal film of the substrate held by the boat transferred into the processing chamber.

\* \* \* \* \*